United States Patent [19]

Schmutz

[11] Patent Number: 5,612,821
[45] Date of Patent: Mar. 18, 1997

[54] MICRO LENS SYSTEM FOR CONTROLLING AN OPTICAL BEAM PATTERN

[75] Inventor: Lawrence E. Schmutz, Watertown, Mass.

[73] Assignee: United Technologies Corporation, Hartford, Conn.

[21] Appl. No.: 490,946

[22] Filed: Jun. 15, 1995

[51] Int. Cl.$^6$ ............................................. G02B 3/00
[52] U.S. Cl. ...................................... 359/622; 359/619
[58] Field of Search .................................... 359/619–620, 359/621–628

[56] References Cited

U.S. PATENT DOCUMENTS 5,139,609  8/1992  Fields ........................................ 156/643

FOREIGN PATENT DOCUMENTS 4110815  4/1992  Japan .

*Primary Examiner*—Georgia Y. Epps
*Assistant Examiner*—John P. Cornely
*Attorney, Agent, or Firm*—McCormick, Paulding & Huber

[57] ABSTRACT

An optical system for use in controlling an output radiation pattern includes a microptic multiplet (MOM) optical of first and second micro-lens modules (MLMs) and an array of optical sources. The system is characterized by a first microptic lens module (MLM) that has lenslets of diameter D positioned in substantial registration with alternate ones of the optical sources. The second MLM has its lenslets positioned in substantial registration with a corresponding lenslet in the first MLM at a separation of 2D. The output radiation pattern can be tailored to the specific application.

13 Claims, 1 Drawing Sheet

MICRO LENS SYSTEM FOR CONTROLLING AN OPTICAL BEAM PATTERN

CROSS REFERENCE TO RELATED APPLICATIONS

Some of the subject matter hereof may be disclosed and/or claimed in the following commonly owned, copending applications which are incorporated herein by reference: "A Micro-Lens Panoramic Imager", U.S. Pat. No. 5,291,334 (Attorney Docket No. 3309-38),"An Optical Instrument With Micro-Lenses", U.S. Pat. No. 5,270,859 (Attorney Docket No. 3309-39), "A Method And Apparatus For Deflecting An Optical Beam", U.S. Ser. No. 08/242,192 now U.S. Pat. No. 5,581,408 (Attorney Docket No. 3309-45) and "A System Having Optically Encoded Information", U.S. Ser. No. 08/243,637 now U.S. Pat. No. 5,479,026 (Attorney Docket No. 3309-48).

TECHNICAL FIELD

The field of the invention relates to that of optical microlenses, and in particular, combinations of arrays of microlenses that form a micro-lens module optical system which controls the optical pattern from an array of optical sources.

BACKGROUND OF THE INVENTION

Arrays of small lenses having a diameter on the order of one millimeter are referred to as micro-lenses or lenslets. Structures incorporating the same have been made in a number of ways and are used for a variety of purposes. An array of micro-lenses has been matched to an array of pixels on a television screen or other raster imaging device. Another use, such as that illustrated in "Agile Beam Steering Using Binary Optics Microlens Arrays", by W. Goltsos and M. Holz, Optical Engineering Vol 29 No. 11, page 1392, is for steering a collimated beam of monochromatic radiation through an angle by translating one of a pair of binary micro-lens arrays that combine to form an array of Galilean telescopes. The beam is required to be monochromatic because binary micro-lenses are highly dispersive.

A variety of optical systems can be formed from select configurations of micro-optic multiplets (MOM) comprised of two or more micro-lens modules (MLM). The MLM's themselves are typically formed from planar arrays of micro-lenses. With these optical systems, a single primary image is formed together with a set of images transversely displaced from an optic axis. MOM's are characterized by the property that the image distance and the object distance move in the same direction, in stark contrast to known lens systems. For example, when an object distance decreases, the corresponding image distance also decreases with the present MLM optical system.

In some applications such as machine vision, the illumination pattern provided by conventional optical sources may not be a good match for a specific application. For example, a wider field illumination may be desirable than can otherwise be generated with conventional optical systems receiving light from optical sources. Moreover, since arrays of light emitting diodes (LED) and laser diode emitters are now available, control over the illumination field is needed. It would be advantageous to utilize pairs of micro-lens arrays to provide illumination control over multiple optical sources in an inexpensive manner. The present optical system is drawn towards such an invention.

SUMMARY OF THE INVENTION

An object of the present invention is to provide for an optical system having a micro-optic multiplet (MOM) that can be tailored to control a radiation pattern.

Another object of the present invention is to provide a system of the forgoing type that includes a pair of microlens modules (MLM) which can be planar in form.

Another object of the present invention is to provide an optical system of the foregoing type that can adjust the illumination pattern differently in orthogonal directions.

According to the present invention, an optical system that includes a micro-optic multiplet (MOM) optical system has an array of optical sources separated a distance D/2. There is a first MLM having an array of lenslets for receiving radiation from an array of optical sources. Each of the lenslets have a diameter D and a lenslet optic axis substantially in registration with a one of the optical sources. A lenslet optic axis passes through every other optical source. The system also includes a second MLM having an array of lenslets for receiving radiation from the first MLM. Each of the second MLM lenslets have a diameter D and a lenslet optic axis substantially in registration with an axis of a corresponding one of said first MLM lenslets. The second MLM is spaced a distance approximately 2D from the first MLM.

DESCRIPTION OF THE PREFERRED EMBODIMENT

Figure 1:
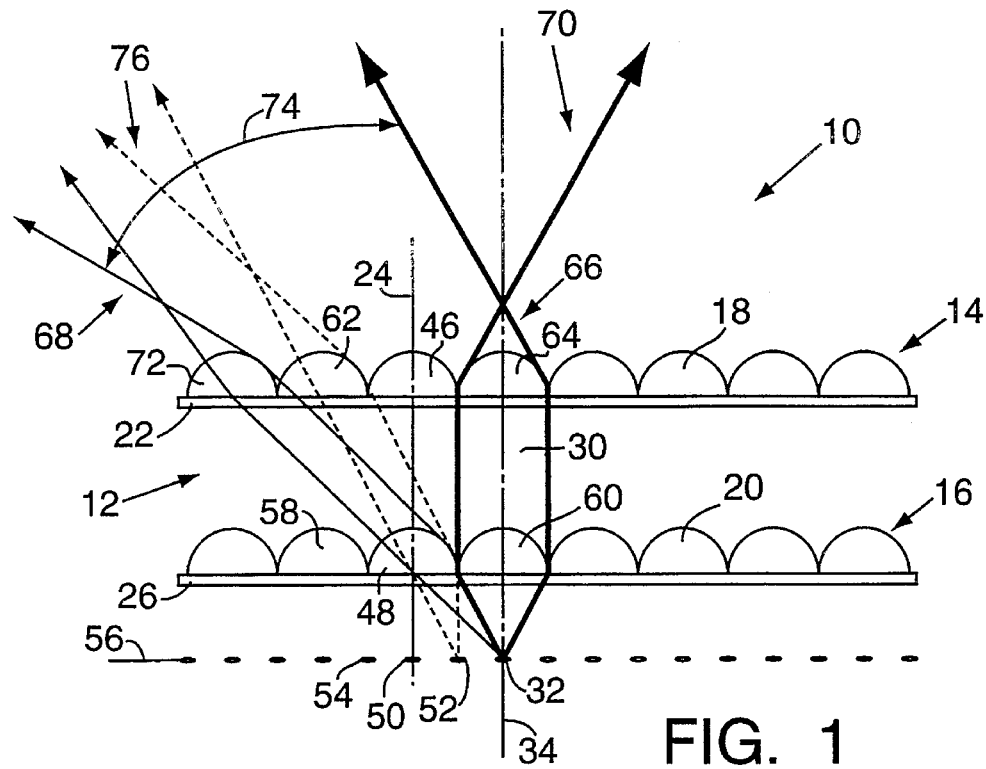
FIG. 1 is a simplified schematic side illustration of a portion of an optical system provided according to the present invention having a monolithic optical multiplet (MOM) that incorporates a pair of monolithic lenslet modules (MLM).

Referring now to Fig. I there is illustrated an optical system 10 including a micro-optic multipier 12 (MOM), which comprises a set of at least two modules 14, 16 (MLM) of micro-lenses. FIG. 1 shows a portion of the MOM 12 on edge. MLM 14 has an array of micro-lenses 18 of diameter $d_1$ and focal length $f_1$. MLM 16 is comprised of an array of micro-lenses 20 of diameter $d_2$ and lens focal length $f_2$. The micro-lenses are alternatively referred to as lenslets. In system 10, the diameter and focal length of the lenslets 18 and 20 are equal and have a magnitude "d". MLMs 14, and 16 are spaced apart a distance 2d.

The MLM's are made from known materials such as optical epoxy, glass, silica, molded plastic or ziric selenide preferably deposited on a substrate, such as substrates 22, 26. The substrates are typically glass or other optically transparent material, although optically opaque or translucent substrates can be used. The lenslets are each characterized by a lenslet optic axis 24. Both of the MLMs 14, 16 can also be deposited on opposed surfaces of a single substrate in certain applications.

MLM 14 is spaced apart from MLM 16 by a distance 2D along MOM optic axis 34. The lenslets in the embodiment of FIG. 1 are positive and each transmit a portion of a light beam 30 emitted by LED 32. The MLM's are configured in FIG. 1 to have their optic axes in registration with MOM axis 34, allowing the beam to be directly transmitted through the optical system without displacement or loss of optical energy, aside from Fresnel (reflection) losses.

The conditions required to form an image with MOM optical systems as well as other design considerations are detailed in the aforementioned copending U.S. patent applications. In sum, a MOM does not have an optic axis in the same sense as does a conventional lens. For purposes of forming an image, the MOM optic axis is taken to be a perpendicular drawn from the image to the MOM. For a collimated beam, the axis of the beam will be taken as the optic axis.

As noted above, machine vision and other industrial applications arrays of light-emitting diodes (LED's) at visible or infrared wavelengths provide scene illumination utilizing continuous illumination. Alternatively, pulsed illumination can be used to freeze motion or coincide with a camera exposure period. LED's, laser diodes, incandescent lamps, etc, may be suitable sources in different situations. Specific devices have specific illumination patterns.

Figure 2:
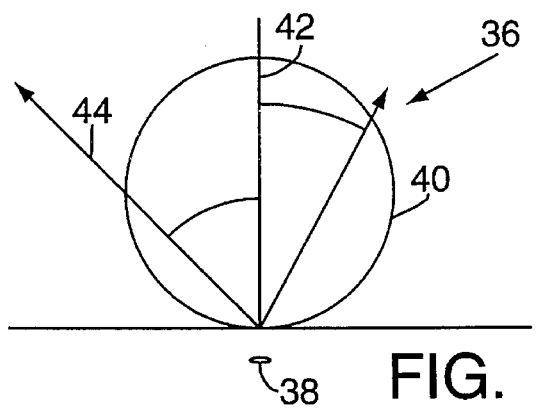
FIG. 2 is a simplified illustration showing an illumination pattern for a single light emitting diode (LED) source.

A good example of a device with a specific illumination pattern is seen in FIG. 2. An optical device 36 includes an LED 38 which has a radiation pattern 40. The radiation pattern in the plane of the drawing is characterized by an optical power distribution which peaks along optic axis 42. The device 36 shows a reduction to approximately half-power at roughly 45° from axis indicated by arrow 44.

This radiation pattern may not be a good match for a specific application. In some circumstances a field illumination wider than 45° maybe required, a value not easily achieved with a single source. One remedy is to mount a number of optical sources at different angles to the optic axis. Arrays of LED's are usually employed with this approach to aggregate the total illumination power far above the available output of a single source.

Further discouraging the use of the above solution are the added costs in fabricating an illuminator from many discrete, individually oriented LED's or laser diodes. However, many vendors now produce planar arrays of LED and/or laser diode emitters with large aggregate powers. These sheet sources are necessarily planar and not capable of manipulation into the multiangular configuration noted above. The present system tailors the illumination pattern of such arrays into a desired pattern using a volume-producable optical element and marks an important point of departure over the prior art.

The present invention accomplishes beam control using the MLMs as shown in FIG. 1. The individual LEDs are registered with both of the optical axis of the complementary lenslets in the MLMs and the boundaries of other lenslets adjacent thereto. In FIG. 1, lenslet 46 is centered about axis 24 as is lenslet 48 of MLM 16. LED 50 is also centered on axis 24, with LEDs 52, 54 positioned in source plane 56 in registration with the boundary of adjacent lenslets 58, 60 in MLM16 and, therefore, lenslets 62, 64 in MLM 14. The LEDs 50–54 are located in the source plane with a total separation of "d".

The present invention allows the definition of two separable LED array patterns: "on-axis" and "off-axis" respectively designated 66, 68 in FIG. 1. For the "on-axis" arrangement, the first order effect of the MLMs is trivial, radiation from the LED is re-imaged with unit magnification, and its emission pattern is unchanged. In the system shown in FIG. 1, ±30° illumination angle 70 is filled.

However, a second-order or sidelobe image of the LED is created by the lenslet displaced one lenslet diameter from the on axis lenslet on the MLM 16 (lenslet 48), and three-lenslet diameters on the MLM 14 (lenslet 72). This is the off axis pattern shown by ray bundle 68. The lenlets pair of 48 and 72 carries the beam to a maximum reflection angle 74 of ±57°.

The "off-axis" LED's such as LED 52 have their intensities divided evenly between two lenslets 48, 60 of MLM 16 a lower lenslet combines with an upper lenslet displaced one position; the resulting ray bundle 76 fills in the angular gap between bundles 68 and 70, giving a continuous illumination pattern from 0° to ±57°. Note that the extreme rays in bundle 76 are parallel to the inner rays of bundles 68 and 70.

The simple relationships of lenslet size, focal length, and MLM spacing were chosen for simplicity of illustration. These parameters may be adjusted to match the characteristics of a specific source device (e.g., laser diode array) and application requirement. Unique features of the present system include (1) the on-axis, off-axis relationship between the lower lenslet array of MLM 16 and the array of optical sources, and (2) the exploitation of second-order or side-lobe combinations of lenslets in the lower and upper MLMs.

Figure 3:
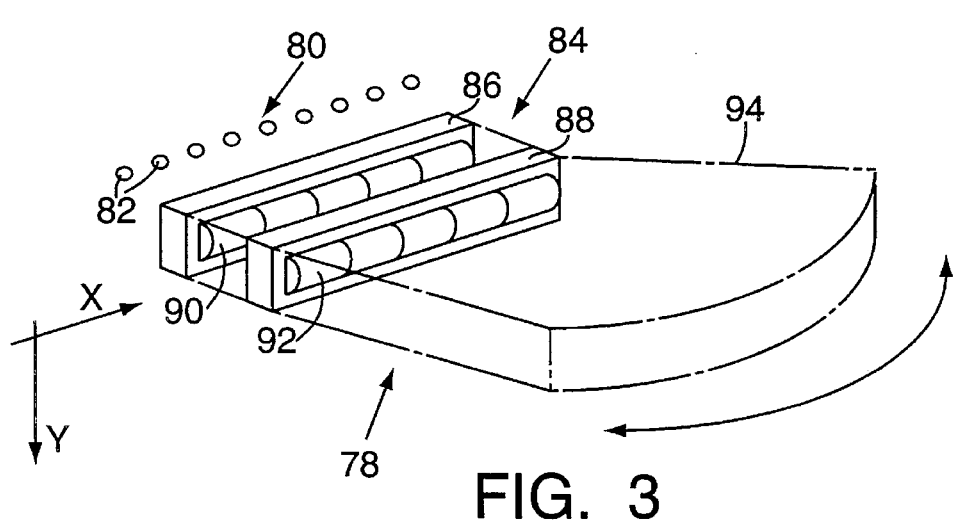
FIG. 3 is a simplified schematic illustration of a portion of an optical system provided according to the present invention characterized by a radiation pattern which differs in two orthogonal axes.

Note that the relationships between the lenslets of a MLM and optical sources may differ in two orthogonal axes. FIG. 3 is a simplified schematic illustration of an alternative optical system provided by the present invention characterized by lenslet and optical source relationships which vary in orthogonal directions. System 78 includes an array of optical sources indicated at 80 comprised of LED's 82. MOM 84 includes MLMs 86 which receives radiation directly form the LEDs and presents the same to MLM 88.

For two dimensional arrays of sources, the spacings of the sources and lenslets along each orthogonal axis may be separately specified. The effective focal lengths of individual lenslets 90, 92 may be separately defined in the X- and Y-axes as well, yielding anarchic lenslets, so that the beam parameters in each axis may be independently controlled. The beam is indicated schematically at 94.

This feature of the present invention is of special interest for laser diodes which have asymmetric emission patterns. Prior systems have always attempted to simply collimate the individual beams of laser diodes as realized in monolithic arrays. The present invention addresses broader applications of scene illumination as well as the controlled coupling of diode laser radiation to solid-state lasing media, such as yitrium—aluminum—garnet (YAG) material, which itself has important commercial significance.

Similarly, although the invention has been shown and described with respect to a preferred embodiment thereof, it should be understood by those skilled in the art that various other changes, omissions and additions thereto may be made therein without departing from the spirit and scope of the present invention. For example, besides being planar in form the optical source and MLM arrays can be cylindrical or annular.

We claim:

1. A micro-optic multiplet (MOM) optical system comprising:

an array of optical sources each emitting radiation and separated a distance D/2;

a first MLM having an array of lenslets for receiving radiation from said optical sources, each of said lenslets having a diameter D and a lenslet optic axis substantially in registration with a one of said optical sources, with a lenslet optic axis passing through every other optical source; and a second MLM having an array of lenslets for receiving radiation from said optical sources, each of said lenslets having a diameter D and a lenslet optic axis substantially in registration with an axis of a corresponding one of said first MLM lenslets, said second MLM spaced a distance approximately 2D from said first MLM.

2. The optical system of claim 1 wherein said MLM and optical source arrays are two dimensional.

3. The optical system of claim 1 further comprising a detector means for generating electrical signal equivalents of said beam received through said lenslet array.

4. The optical system of claim 1 wherein said optical sources not located in registration with said lenslet optic axes are located in registration with a position in said first MLM where adjacent lenlets abut.

5. The optical system according to claim 1, in which said first and second MLMs are separated from one another by an axial distance substantially equal to the sum of the focal lengths of the lenslets in said first and second MLMs.

6. The optical system of claim 2 further comprising a cylindrical MOM wherein said first and second MLM's and said optical source arrays are configured on a concentric cylindrical surfaces.

7. The optical system of claim 2 further comprising an annular MOM wherein said first and second MLM's and said optical source arrays are configured in adjacent sectors of a substantially planar annulus.

8. The optical system of claim 1 further comprising an optically transparent substrate for receiving said first MLM lenslet array on a first outer substrate surface and said second MLM lenslet array on an opposed second outer substrate surface.

9. The optical system of claim 8 wherein said substrates have a thickness chosen in dependence on the desired optical system focal length.

10. The optical system of claim 1 wherein said optical sources comprises laser diodes.

11. The optical system of claim 1 wherein said optical sources comprises light emitting diodes (LEDs).

12. The optical system of claim 2 wherein said MLM lenslets are anamorphic.

13. The optical system of claim 2 wherein said optical sources have separations which differ in magnitude in orthogonal directions.

* * * * *